Figure 1:
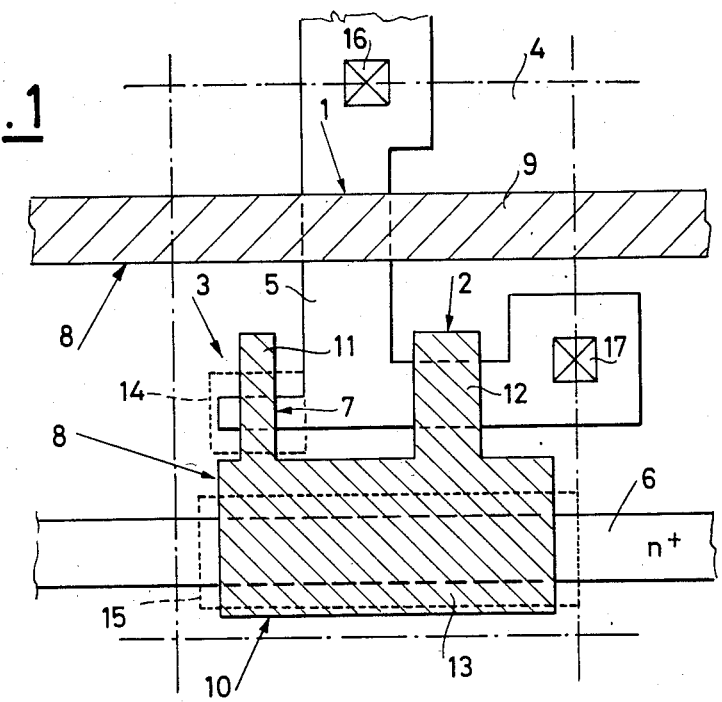

United States Patent [19]

Riva

[11] Patent Number: 4,823,316
[45] Date of Patent: Apr. 18, 1989

[54] EEPROM MEMORY CELL WITH A SINGLE POLYSILICON LEVEL AND A TUNNEL OXIDE ZONE

[75] Inventor: Carlo Riva, Monza, Italy

[73] Assignee: SGS Microelettronica S.p.A., Catania, Italy

[21] Appl. No.: 119,498

[22] Filed: Nov. 12, 1987

[30] Foreign Application Priority Data

Nov. 18, 1986 [IT] Italy ................. 22373 A/86

[51] Int. Cl.⁴ ...................... G11C 13/00; G11C 11/40
[52] U.S. Cl. ................... 365/185; 365/182; 365/149; 365/150; 357/23.5; 357/23.6

[58] Field of Search ............. 365/185, 182, 149, 189, 365/150; 357/23.5, 23.6

[56] References Cited

U.S. PATENT DOCUMENTS 4,754,320  6/1988  Mizutani et al. .............. 365/185

Primary Examiner—Terrell W. Fears
Attorney, Agent, or Firm—Cushman, Darby & Cushman

[57] ABSTRACT

The memory cell comprises a selection transistor, pickup transistor and a tunnel condenser formed using a single layer of polysilicon. The tunnel condenser is formed on an active area distinct and separate from that of the pickup transistor.

2 Claims, 2 Drawing Sheets

EEPROM MEMORY CELL WITH A SINGLE POLYSILICON LEVEL AND A TUNNEL OXIDE ZONE

DESCRIPTION

The present invention relates to an EEPROM memory cell with a single polysilicon level programmable for a Fowler-Nordheim tunnel through a thin oxide zone.

In the literature can be found some EEPROM cells with a single polysilicon level which are written and cancelled for Fowler-Nordheim tunnel through a thin oxide or tunnel oxide, utilizing the capacitive couplings between the control gate, floating gate and semiconductor substrate.

These cells comprises a selection transistor, a pickup transistor and a tunnel condenser, defined by a thin oxide zone with implantation of n−phosphorous partially superimposed on the drain diffusion of the pickup transistor. A single layer of polysilicon forms the gate of the selection transistor and, separately, an armature of the tunnel condenser and the floating gate of the pickup transistor in a single piece with an armature of the coupling condenser of the control gate formed with an n+diffusion.

A drawback of these known cells is the fact that the tunnel zone is placed on the same active area (n+drain diffusion) of the pickup transistor. For this reason the thin oxide can be found supporting electrical stresses due to the voltage applied during the pickup of the cell and during the writing operations of the other memory cells.

The object of the present invention is to achieve an EEPROM memory cell with a single polysilicon level and tunnel oxide zone which would be free of the aforesaid drawback.

In accordance with the invention said object is achieved by an EEPROM memory cell comprising a selection transistor, a pickup transistor with floating gate and control gate, and a tunnel condenser with a thin oxide zone formed by using a single polysilicon layer for the floating gate and the tunnel condenser and at least one active area with n+diffusion for the control gate characterized in that said thin oxide zone of the tunnel condenser is formed on an active area distinct and separate from that of the pickup transistor, which is in series with said control gate diffusion.

In this manner the thin oxide zone is electrically separated from the pickup transistor with resulting reduction of the electrical stresses originating from the pickup voltage. In addition, having the pickup transistor in series with the n+diffusion of the control gate makes its capacity toward the substrate and toward said diffusion contribute to increasing the effectiveness of the programming voltages applied, going to increase the capacitive couplings which control the voltage drop on the thin oxide.

Figure 2:
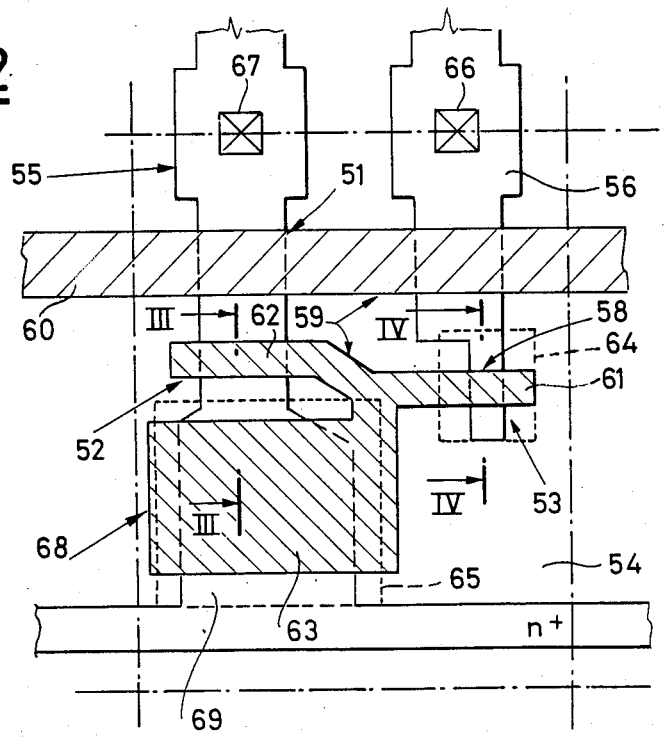
Figure 3:
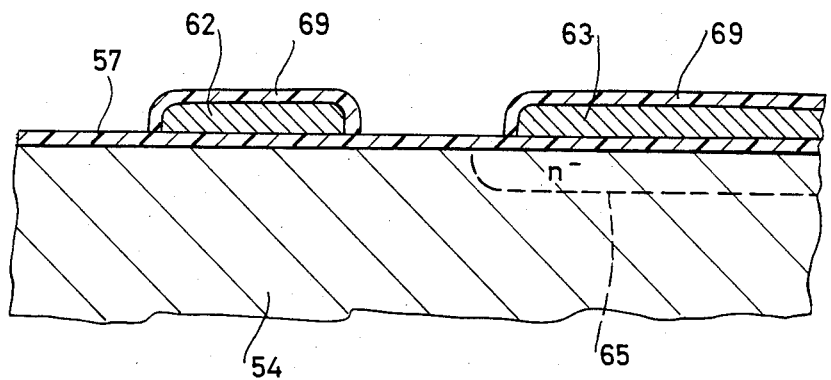
Figure 4:
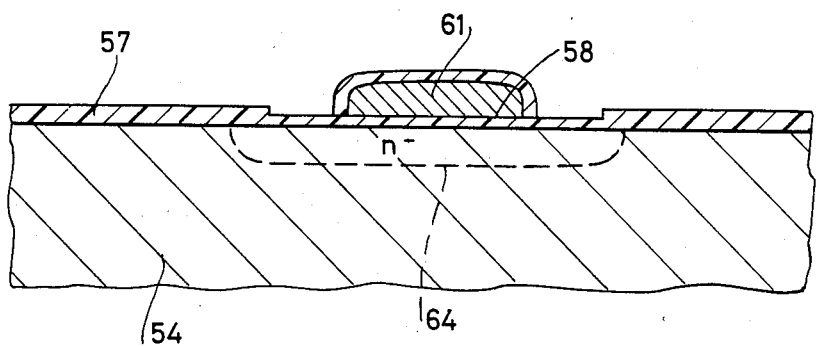

The characteristics of the present invention will be better understood by observing the annexed drawings wherein:

FIG. 1 shows schematically a plan of the conformation of an EEPROM cell with a single polysilicon level in accordance with the known art, FIG. 2 shows a similar plan representation of a cell in accordance with the invention, FIG. 3 shows a cross section of the cell in accordance with the invention along line III—III of FIG. 2, and FIG. 4 shows a cross section of the cell in accordance with the invention along line IV—IV of FIG. 2.

FIG. 1 illustrates an EEPROM memory cell in accordance with the known art which comprises a selection transistor 1, a pickup transistor 2 and a tunnel condenser 3.

More precisely, on a semiconductor substrate 4 having active areas with n+diffusion 5 and 6 and including a thin oxide zone 7 on the active area 5 is deposited a single layer of polysilicon 8 formed of a transverse strip 9, which defines the gate of the selection transistor 1 and a U part 10 which has a first longitudinal branch 11 placed on the thin oxide zone 7 and then on the active area 5 to form the tunnel condenser 3, a second longitudinal branch 12 placed similarly on the active area 5 to form the floating gate of the pickup transistor 2 and a space 13 placed on the active area 6 to form a condenser coupling with the control gate of the transistor 2, defined by the n+diffusion of the active area 6. Two n−diffusions 14 and 15 are made at the thin oxide zone 7 and at the aforesaid control gate to ensure electrical continuity of the cell. Reference number 16 indiates the drain contact and reference number 17 indicates an output contact.

In FIGS. 2–4 is illustrated a memory cell in accordance with the invention in which the selection transistor is indicated by reference number 51, the transistor by reference number 52 and the tunnel condenser by reference number 53.

As shown in FIG. 2, on a substrate 54 are provided two active areas with n+diffusion 55 and 56. On the structure is grown gate oxide 57 (FIG. 3 and 4) which presents a thin oxide zone 58 at the active area 56 (FIG. 2). A single polysilicon layer 59 further superimposed comprises a transverse strip 60 which defines the gate of the selection transistor 51, and another part 68 formed of a first arm 61 superimposed on the thin oxide zone 58, and then on the active area 56, to form the tunnel condenser 53, a second arm 62 superimposed on the active area 55 to form the floating gate of the pickup transistor 52 and finally a space 63 further superimposed on the active area 55 to form the coupling condenser of the control gate, defined by the n+diffusion 69 of said active area 55. Two n−diffusions 64 and 65 are made at the thin oxide zone and the aforesaid control gate to ensure electrical continuity of the cell. Reference number 66 indicates a drain contact and reference number 67 indicates an output contact. More oxide 69 is superimposed on the polysilicon layer 69 (FIGS. 3 and 4).

The manner of operation of the cell in accordance with the invention is substantially identical to that of conventional cells and will therefore not be described in detail.

The only exception occurs during the pickup phase when the drain contact 67 is brought to high potential, the n+line of the control gate (69) is grounded and the gate 60 of the selection transistor 51 is placed at a potential higher than that of the theshhold.

I claim:

1. EEPROM memory cell comprising a selection transistor, a pickup transistor with floating gate and control gate, and a tunnel condenser with thin oxide zone formed using a single layer of polysilicon for the floating gate and the tunnel condenser and at least one active area with n+diffusion for the control gate said thin oxide zone of the tunnel condenser being formed on an active area distinct and separate from that of the pickup transistor, the active area of the pickup transistor being serially connected with said diffusion of the control gate.

2. Memory cell in accordance with claim 1 characterized in that said single polysilicon layer comprises a first part defining the gate of the selection transistor and a second part formed of a first arm superimposed on the thin oxide zone on said distinct and separate active area, a second arm superimposed on said at least one active area to form the floating gate of the pickup transistor and a space further superimposed on said at least one active area to form a coupling condenser of the control gate.

* * * * *